(12) United States Patent
Brodsky

(10) Patent No.: US 7,083,436 B2
(45) Date of Patent: Aug. 1, 2006

(54) PARTICLE DISTRIBUTION INTERPOSER AND METHOD OF MANUFACTURE THEREOF

(75) Inventor: William L. Brodsky, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 09/799,936

(22) Filed: Mar. 6, 2001

(65) Prior Publication Data

US 2002/0127893 A1    Sep. 12, 2002

(51) Int. Cl.
*H01R 4/58*    (2006.01)

(52) U.S. Cl. ........................................ 439/91

(58) Field of Classification Search ................ 264/104, 264/105, 272; 29/876, 852; 439/66, 91, 439/591; 427/97.2
See application file for complete search history.

(56) References Cited

U.S. PATENT DOCUMENTS

| | | | | |
|---|---|---|---|---|
| 4,008,300 A | * | 2/1977 | Ponn | |
| 4,050,756 A | * | 9/1977 | Moore | |
| 4,067,945 A | * | 1/1978 | DuRocher | 264/104 |
| 4,449,774 A | * | 5/1984 | Takashi et al. | |
| 4,705,205 A | * | 11/1987 | Allen et al. | 228/180.22 |
| 5,145,691 A | * | 9/1992 | Kawakami et al. | 425/110 |
| 5,630,272 A | * | 5/1997 | Wenke | 29/852 |
| 5,648,104 A | | 7/1997 | El-Sobky | |
| 5,702,546 A | | 12/1997 | Itoh et al. | |
| 5,846,356 A | | 12/1998 | Vyakarnam et al. | 156/62.6 |
| 5,888,340 A | | 3/1999 | Vyakarnam et al. | 156/379.7 |
| 5,949,029 A | | 9/1999 | Crotzer et al. | 174/254 |
| 6,004,499 A | | 12/1999 | Bishop et al. | 264/437 |
| 6,271,482 B1 | * | 8/2001 | Crotzer et al. | 174/262 |

* cited by examiner

*Primary Examiner*—Neil Abrams
(74) *Attorney, Agent, or Firm*—Pastel Law Firm; Christopher R. Pastel

(57) ABSTRACT

An interposer comprising a non-conductive carrier sheet with a pre-arranged pattern of conductive interconnect members positioned therethrough and formed from an elastomeric thermoplastic with suspended spherical and non-spherical conductive particles. The non-spherical conductive particles of the present invention are positioned substantially perpendicularly to and partially through the contact faces of the interconnect member, thereby resulting in higher conductivity and efficiency. The interposer is formed by a mold comprising two sections with first and second sets of vias formed in the first and second mold sections, respectively, which permit the injected elastomer mixture to flow completely through the mold cavity and thereby aligns the non-spherical conductive particles. The exit side of the mold is further contacted by support posts of a separable mold interface creating a network of vent passages for venting of air and the elastomer mixture, resulting in less pressure within the mold and less mold flash.

4 Claims, 2 Drawing Sheets

PARTICLE DISTRIBUTION INTERPOSER AND METHOD OF MANUFACTURE THEREOF

BACKGROUND OF THE INVENTION

1. Field of Invention

The present invention relates generally to interposers used in integrated semiconductor packages, and more particularly to a mold and method for fabricating interposers having improved structural and electrical integrity.

2. Description of Prior Art

Developments in integrated chip packages have substantially increased the amount of wiring required for input/output connections, while the sizes of the packages have decreased dramatically. Electrical leads for the I/O connections placed around the perimeter of the chip are restricted in number by the limited space around the ever shrinking chip. One method of handling the increase in number of I/O connections has been to replace the electrical leads with electrical contacts mounted on the surface of the chip instead of the contacts extending around the perimeter.

Several problems arise when a chip with surface mounted electrical contacts is brought in direct contact with a circuit board. For example, soldering the chip directly to the circuit board makes replacement infeasible. Furthermore, the complexity of the wiring leads to cost prohibitive methods of manufacturing. To solve the various problems, a device was designed to interconnect the chip with the circuit board. These interconnect devices are commonly referred to as "interposers." Interposers offer the advantages of self-centering during assembly, accommodation of higher I/O connections, and enhanced chip performance.

A common example of an interposer is a ductile direct electrical interconnecting device comprising a non-conductive carrier sheet with conductive interconnect members positioned in spaced relation to one another mounted therein. The interconnect members are arranged to individually contact the surface mounted I/O connections and extend through the insulator sheet to contact the electrical contacts of a circuit board on the other side. The interconnect members are typically composed of conductive particles suspended in an elastomer or epoxy and may contain a variety of spherical and non-spherical particles formed from conductive metals.

Interposers are sometimes formed by an injection molding process. FIG. 1 illustrates a typical prior art mold 100 useful for forming interposers. Mold 100 comprises an upper mold section 102 and a lower mold section 104 that sandwiches a non-conductive carrier sheet 114 with passages 106 formed therethrough. Upper mold section 102 includes an entrance via 108 that provides a passage into the upper and lower mold cavities 110, 112, which form the upper and lower contact faces of the interconnect members 116, respectively.

In the typical injection method, an elastomeric mixture containing the conductive particles is injected through via 108 where it then passes through passages 106 in non-conductive carrier sheet 114 and stops in the lower half of the mold. As a result of the injection of the conductive elastomer into the mold cavity, any air contained within the mold is displaced. This displacement of the air within the mold cavity results in venting of the air along the intersection of the two mold sections as it is the primary avenue for escape. The venting along the non-conductive carrier sheet allows some of the elastomer mixture to escape along the non-conductive carrier sheet, which results in a condition commonly referred to in the art as "mold flash." The occurrence of mold flash prevents the use of smaller and more electrically efficient materials in constructing the interconnect elements, thus negatively affecting the potential electrical performance of the interposer.

Due to the flow pattern of the elastomeric mixture and flow stoppage in the lower section of the mold, the conductive particles often settle and become positioned horizontally. This settling results in a loss of conductivity at the contact surface of the newly formed interconnect members due to the conductive particles not extending through the end of the elastomer.

3. Objects and Advantages

It is a principal object and advantage of the present invention to provide an interposer with interconnect members having enhanced electrical performance.

It is an additional object and advantage of the present invention to provide a method for making interposer interconnect members with improved conductive particle distribution.

It is a further object and advantage of the present invention to provide a method of making interposers with less flashing or loss of elastomeric material.

Other objects and advantages of the present invention will in part be obvious, and in part appear hereinafter.

SUMMARY OF THE INVENTION

In accordance with the foregoing objects and advantages, the present invention provides a more effective interposer for use with an integrated chip package. The interposer of the present invention comprises a non-conductive carrier sheet with conductive interconnect members mounted therein and positioned in spaced relation to one another. The conductive interconnect members are formed from an elastomeric material having a mixture of spherical and non-spherical conductive particles suspended therein. Due to the fabrication method and structure, the non-spherical conductive particles of the present invention are positioned substantially perpendicularly to the contact face of the interconnect member, thereby resulting in higher conductivity and efficiency.

The mold of the present invention comprises a two piece mold with first and second sets of vias formed in the first and second mold sections, respectively, which permit the injected elastomer mixture to flow completely through the mold cavity. This flow pattern aligns the non-spherical conductive particles within the elastomer substantially perpendicular to, and extending partially through, the contact face of the newly formed interconnect member. The exit side of the two piece mold is further contacted by support posts of a separable mold interface that together define a network of vent passages. The vent passages created by the mold interface allow venting of the mold cavities and the exit flow of the elastomer mixture.

The method of the present invention facilitates fabrication of an interposer such that the conductive particles suspended in the elastomer solution are positioned substantially perpendicularly to the contact surfaces of the formed interconnect members. This perpendicular positioning results in an overall increase in conductivity due to the extension of the conductive particles through the end of the contact faces of the interconnect members. Furthermore, due to the improved flow pattern and venting through the second set of vias, there is less pressure within the mold during injection, resulting in less mold flash along the non-conductive carrier. Mold flash can result in bridging of electrical current between adjacent conductive members when the interposer is utilized.

Reduced mold flash also allows use of particles of lower molecular weight and smaller polymer chains to fabricate the interconnect members. Use of smaller particles would otherwise increase the amount of bridging because they can more easily escape along the non-conductive carrier than larger particles, thus increasing the amount of mold flash. The venting through the second set of vias alleviates this mold flash, however, and the use of smaller particles and polymer chains does not increase mold flash and bridging. Smaller particles and polymer chains are beneficial to further increases the efficiency and conductivity of the interposer because they tend to follow the flow pattern better than larger particles and thus form more conductive contact faces on the interconnect members.

DETAILED DESCRIPTION

Figure 3:
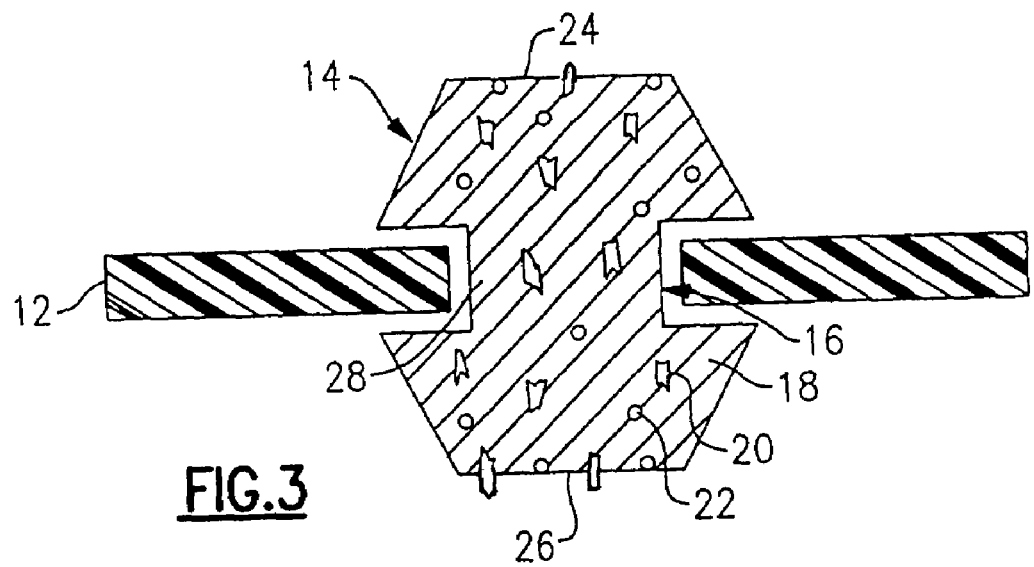
FIG. 3 is a longitudinal, cross-sectional view of the interposer of the present invention
Figure 2:
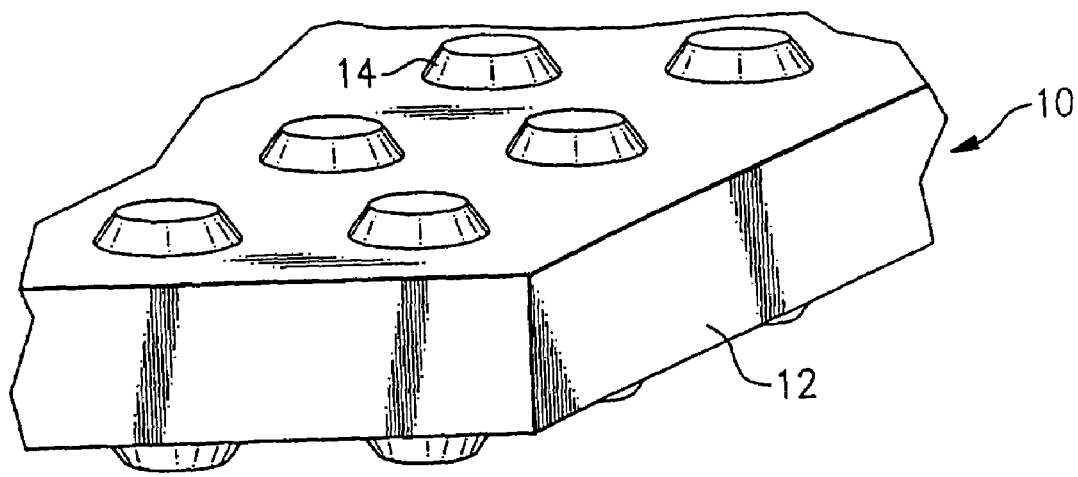
FIG. 2 is a perspective view of a typical interposer.

Referring now to the drawings wherein like reference numerals refer to like parts throughout, there is seen in FIG. 2 an interposer, designated generally by reference numeral 10, comprising a non-conductive carrier sheet 12 and conductive interconnect members 14. Non-conductive carrier sheet 12 is a conventional insulator material used in flexible circuits, e.g., a polyimide such as DuPont Kapton® or a polyester such as DuPont Mylar®, with an array of passages 16, as illustrated in FIG. 3, that extend completely though the sheet in a predetermined pattern. The passages 16 containing the conductive interconnect elements 14 can be arranged to correspond to the electrical contacts on a chip and a printed circuit board to which the chip, for instance, is to be attached.

Conductive interconnect member 14 comprises a substantially homogeneous elastomeric mixture of an elastomeric material 18 and a plurality of conductive particles 20, 22. Elastomeric material 18 can be composed of a flexible thermoset or thermoplastic material, such as an epoxy or siloxane, to provide contact compliance. A preferred material would be a thermoset siloxane that at the time of fabrication is in a viscous state. Elastomeric material 18 is packed with conductive particles 20, 22 to approximately fifteen to sixty percent by volume (the "packing ratio") to achieve the desired conductivity. This packing ratio is dependant upon the point at which the percolation threshold of the elastomer is met after the elastomeric mixture is compressed. The conductive particles 20, 22 can be fabricated from various conductive materials, such as silver, gold, carbon, and nickel and formed into a combination of spherical and non-spherical shapes.

Figure 1:
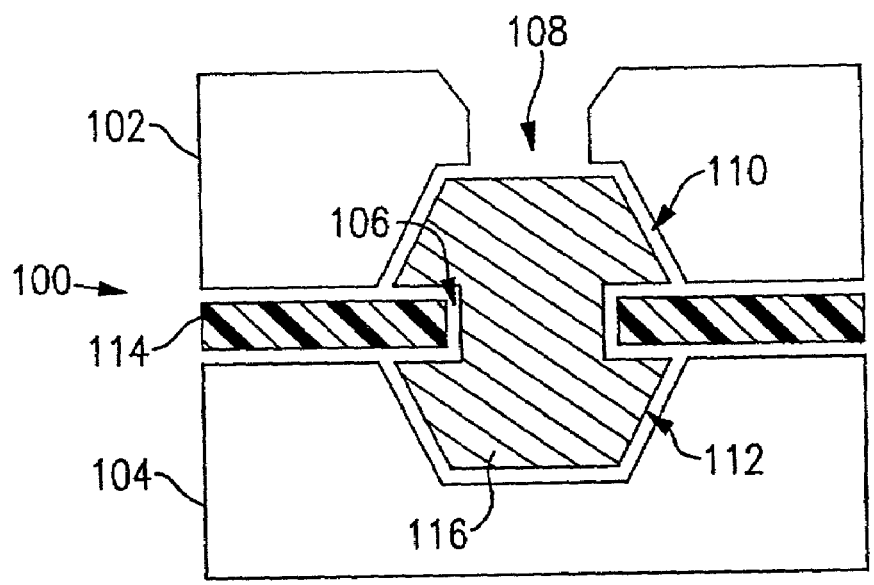
FIG. 1 is a cross-sectional view of a prior art mold used to fabricate an interposer.
Figure 4:
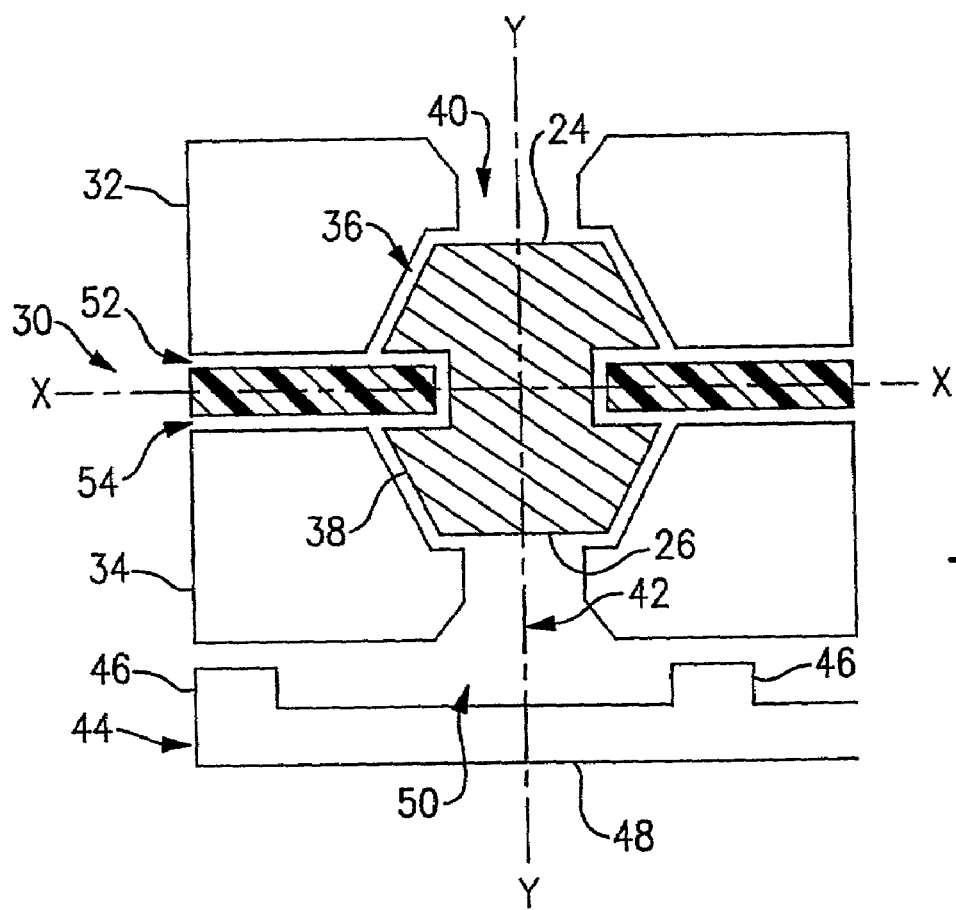
FIG. 4 is a cross-sectional view of the mold used to fabricate an interposer according to the present invention.

Referring to FIG. 4, mold 30 comprises upper mold section 32 and lower mold section 34. Mold sections 32, 34 are formed from any commonly used material for manufacturing molds, such as oil hardening tool steel, and may vary in size to encompass the number and depth of interconnect members desired in the interposer 10 that is to be manufactured. Mold sections 32, 34 contain mold cavities 36, 38, respectively, that are primarily trapezoidally shaped in longitudinal cross-section such that the cavities 36, 38 are widest adjacent the carrier sheet 16 and tapering inwardly toward the outer ends. Upper mold section 32 includes entrance via (or vias) 40 that provides access to upper mold cavity 36. The lower mold section 34 contains a corresponding exit via (or vias) 42 continuous with the lower mold cavity 38. Entrance via 40, mold cavities 36, 38, and exit via 42 are at least partially axially aligned along axis Y—Y to promote the flow of elastomeric mixture introduced into mold 30.

The shape of interconnect member 14 is defined by the upper and lower mold cavities 36, 38, respectively, and which may be selected based upon the intended use for the interposer 10, i.e., whether it is to be used in a ball grid array, bump array, or other system which dictates the particular shape required.

Mold 30 is supported by mold interface 44 to which it is removably mounted. More specifically, support posts 46 extend upwardly from the base 48 of mold interface 44, contact the lower mold section 34, define a vent passage 50 in the space between support post 46, base 48, and lower mold section 34. Vent passage 50 is in fluid communication with exit via 42 of lower mold section 34, and provides venting of pressure in the upper and lower mold cavities 36, 38, respectively, created by the injection of elastomeric mixture (i.e., the elastomeric material 18 with conductive particles 20, 22 suspended therein) into mold 30. The amount of mold flash along passages 52,54 is severely reduced due to the venting with concurrent escape of elastomer mixture occurring primarily through exit via 42. In addition, due to a portion of the elastomer mixture flowing out of exit via 42, a flow pattern of elastomer mixture results, wherein at least a portion of non-spherical particles 20 are positioned essentially perpendicular and partially through the contact face 26. As is known in the prior art, a fluid traveling in one direction imparts a unidirectional shearing force to objects contained therein, so that non-spherical bodies contained in the fluid become aligned with the direction of the flow.

The method of fabricating interposer 10 involves utilization of mold 30 with exit via 42, as described above. The elastomer mixture is first introduced into mold 30 through entrance via 40, i.e., by fluid injection or any similar process. Injection of the elastomer mixture continues until a predetermined amount exits mold 30 through exit via 42. The exit of the elastomer mixture from exit via 42 creates a flow pattern in lower mold cavity 38 that positions at least of portion of the non-spherical conductive particles 20 parallel to the direction of the flow pattern and, consequently, substantially perpendicular to lower contact face 26 formed by lower mold cavity 38. This flow pattern results in portions of non-spherical particles 20 extending partially through the contact face, thereby enhancing the conductive properties of interposer 10.

What is claimed is:

1. An interposer, comprising: a sheet having an opening formed therethrough;

an interconnect member extending through said opening and comprising a mixture of non-spherical and spherical conductive particles suspended in an elastomeric material and opposed first and second end surfaces;

said conductive particles being suspended in substantially straight flow lines running from said first end surface to said second end surface;

said non-spherical conductive particles including a plurality of elongated conductive particles;

a portion of said sheet extending into said interconnect member, thereby securely positioning said interconnect member in said opening; and first and second portions of said elongated conductive particles extending through said first and second end surfaces, respectively;

said interconnect member being formed using mold sections that include a pressure venting exit via that extends substantially parallel to a central axis of said interconnect member whereby said straight flow lines are produced:

wherein said elongated conductive particles aligned parallel with said flow lines are substantially perpendicular to said first and second end surfaces, and wherein said interconnect member has a varying cross-section.

2. The interposer of claim 1, wherein said elastomeric material is a thermoplastic elastomer.

3. The interposer of claim 1, wherein said conductive member comprises between 15% to 60% conductive particles by volume.

4. The interposer of claim 1, wherein said sheet is composed of a non-conductive material.

* * * * *